US011127650B2

(12) United States Patent
Chang Chien et al.

(10) Patent No.: US 11,127,650 B2
(45) Date of Patent: Sep. 21, 2021

(54) SEMICONDUCTOR DEVICE PACKAGE INCLUDING THERMAL DISSIPATION ELEMENT AND METHOD OF MANUFACTURING THE SAME

(71) Applicant: Advanced Semiconductor Engineering, Inc., Kaohsiung (TW)

(72) Inventors: Chien Lin Chang Chien, Kaohsiung (TW); Chiu-Wen Lee, Kaohsiung (TW); Hung-Jung Tu, Kaohsiung (TW); Chang Chi Lee, Kaohsiung (TW); Chin-Li Kao, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 16/799,751

(22) Filed: Feb. 24, 2020

(65) Prior Publication Data

US 2021/0265231 A1 Aug. 26, 2021

(51) Int. Cl.
*H01L 23/36* (2006.01)
*H01L 21/48* (2006.01)
*H01L 23/48* (2006.01)
*H01L 23/367* (2006.01)
*H01L 23/00* (2006.01)

(52) U.S. Cl.
CPC ........ *H01L 23/367* (2013.01); *H01L 21/4882* (2013.01); *H01L 23/481* (2013.01); *H01L 24/20* (2013.01)

(58) Field of Classification Search
CPC ..... H01L 23/367; H01L 23/481; H01L 24/20; H01L 23/4334; H01L 23/5381; H01L 23/36; H01L 23/3121; H01L 23/3135
USPC ........................................................ 257/712
See application file for complete search history.

(56) References Cited

U.S. PATENT DOCUMENTS

| 8,378,480 | B2 | 2/2013 | Chen et al. | |
|---|---|---|---|---|
| 10,461,007 | B2 | 10/2019 | Dias et al. | |
| 2014/0340849 | A1* | 11/2014 | Kim | H01L 23/36 361/717 |
| 2018/0175011 | A1* | 6/2018 | Sung | H01L 23/5381 |
| 2019/0295917 | A1* | 9/2019 | Kim | H01L 23/4334 |
| 2020/0135710 | A1* | 4/2020 | Kim | H01L 23/3135 |
| 2020/0203248 | A1* | 6/2020 | Nair | H01L 23/3121 |

OTHER PUBLICATIONS

U.S. Appl. No. 16/508,210, filed Jul. 10, 2019, Chen et al.

* cited by examiner

*Primary Examiner* — Didarul A Mazumder
(74) *Attorney, Agent, or Firm* — Foley & Lardner LLP

(57) ABSTRACT

The present disclosure provides a semiconductor device package. The semiconductor device package includes a first die, a second die, and a thermal dissipation element. The first die has a first surface. The second die is disposed on the first surface. The thermal dissipation element is disposed on the first surface. The thermal dissipation element includes a first portion extending in a first direction substantially parallel to the first surface and partially covered by the second die and a second portion extending in a second direction substantially perpendicular to the first surface to be adjacent to an edge of the second die.

19 Claims, 30 Drawing Sheets

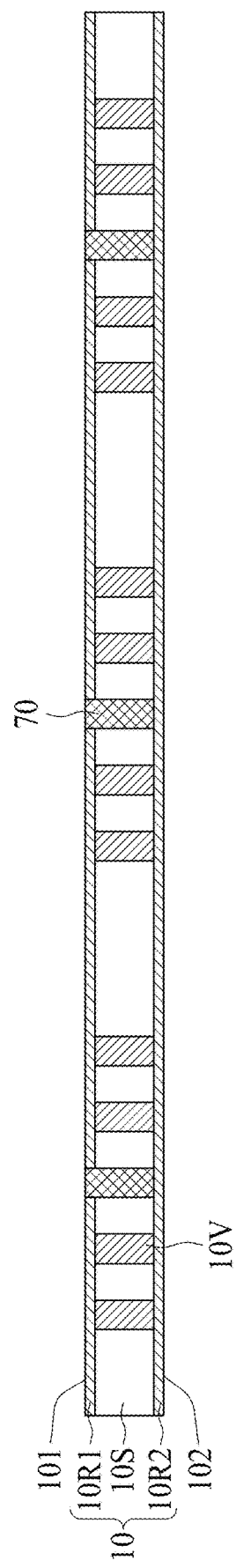

SEMICONDUCTOR DEVICE PACKAGE INCLUDING THERMAL DISSIPATION ELEMENT AND METHOD OF MANUFACTURING THE SAME

BACKGROUND

1. Technical Field

The present disclosure generally relates to a semiconductor device package, and to a semiconductor device package with a thermal dissipation element and a method of manufacturing the same.

2. Description of the Related Art

In pursuit of high efficient electrical performance, multiple semiconductor dies are usually stacked. A semiconductor device package such as a 3DIC package may include a substrate, a plurality of semiconductor dies stacked on the substrate to minimize the size of the semiconductor device package and to pursuing high efficiency electrical performance. However, the thermal dissipation from the upper semiconductor die(s) to the external environment may be hindered because the thermal dissipation path established among the plurality of semiconductor dies and the substrate is relatively long. As a result, the electrical performance of the upper semiconductor die(s) would be adversely affected by poor thermal efficiency.

SUMMARY

In one or more embodiments, a semiconductor device package includes a first die, a second die, and a thermal dissipation element. The first die has a first surface. The second die is disposed on the first surface. The thermal dissipation element is disposed on the first surface. The thermal dissipation element includes a first portion extending in a first direction substantially parallel to the first surface and partially covered by the second die. The thermal dissipation element further includes a second portion extending in a second direction substantially perpendicular to the first surface to be adjacent to an edge of the second die.

In one or more embodiments, a semiconductor device package includes a first electronic component, a second electronic component, and a first thermal dissipation element. The first electronic component including a plurality of through vias. The second electronic component disposed on the first electronic component. The first thermal dissipation element includes a first portion disposed between the first electronic component and the second electronic component. The first thermal dissipation element further includes a second portion connected to the first portion and extending through the first electronic component. The first thermal dissipation element is electrically floated from the plurality of through vias.

In one or more embodiments, a method of manufacturing a semiconductor device package includes providing a first die and at least one second die and forming a thermal dissipation element between the first die and the at least second die. The thermal dissipation element includes a first portion disposed between the first die and the at least one second die, and a second portion protruding from the first portion.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

FIG. 7A, FIG. 7B, and FIG. 7C illustrate one or more stages of a method for manufacturing a semiconductor device package in accordance with some embodiments of the subject application.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
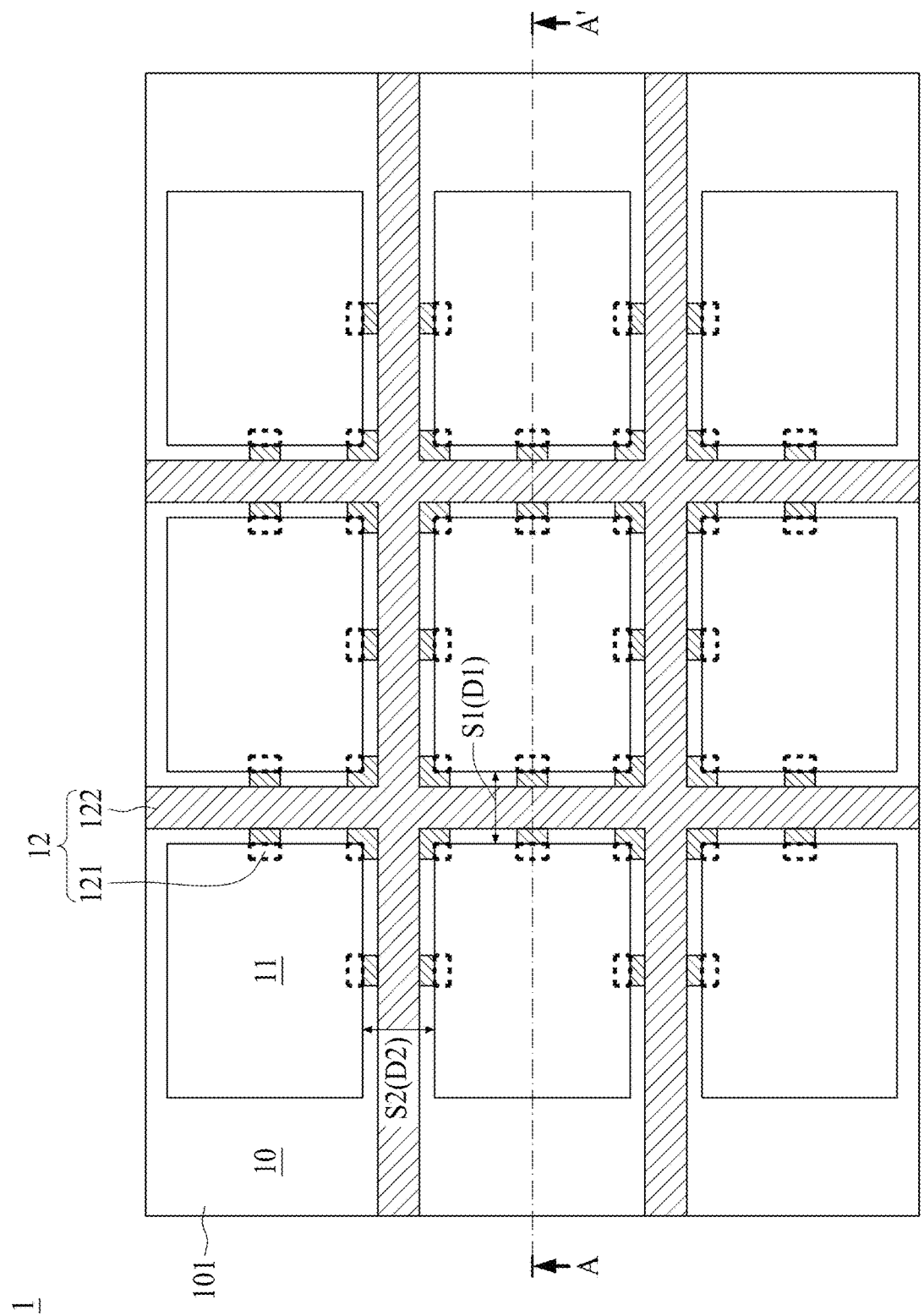
FIG. 1A illustrates a top view of a semiconductor device package in accordance with some embodiments of the present disclosure.

The following disclosure provides for many different embodiments, or examples, for implementing different features of the provided subject matter. Specific examples of components and arrangements are described below. These are, of course, merely examples and are not intended to be limiting. In the present disclosure, reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

Figure 1B:
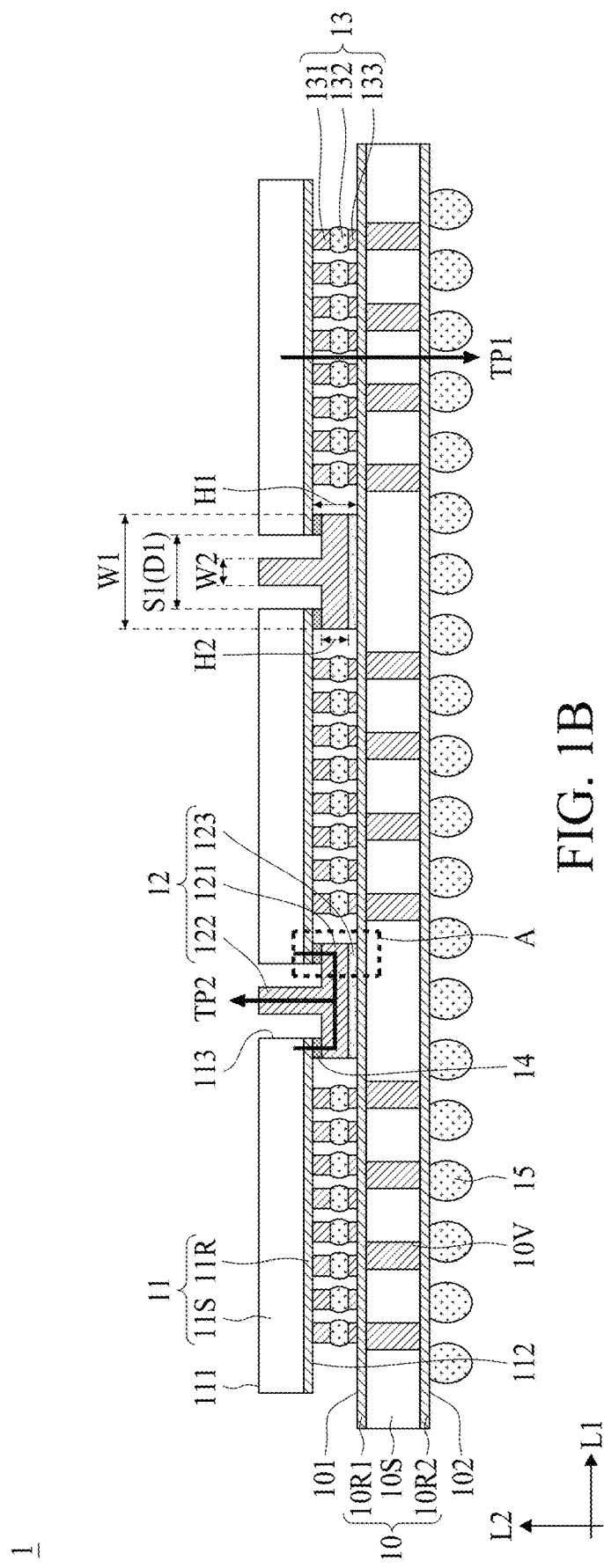
FIG. 1B illustrates a cross-sectional view of the semiconductor device package along the A-A' line in FIG. 1A in accordance with some embodiments of the present disclosure.
Figure 1C:
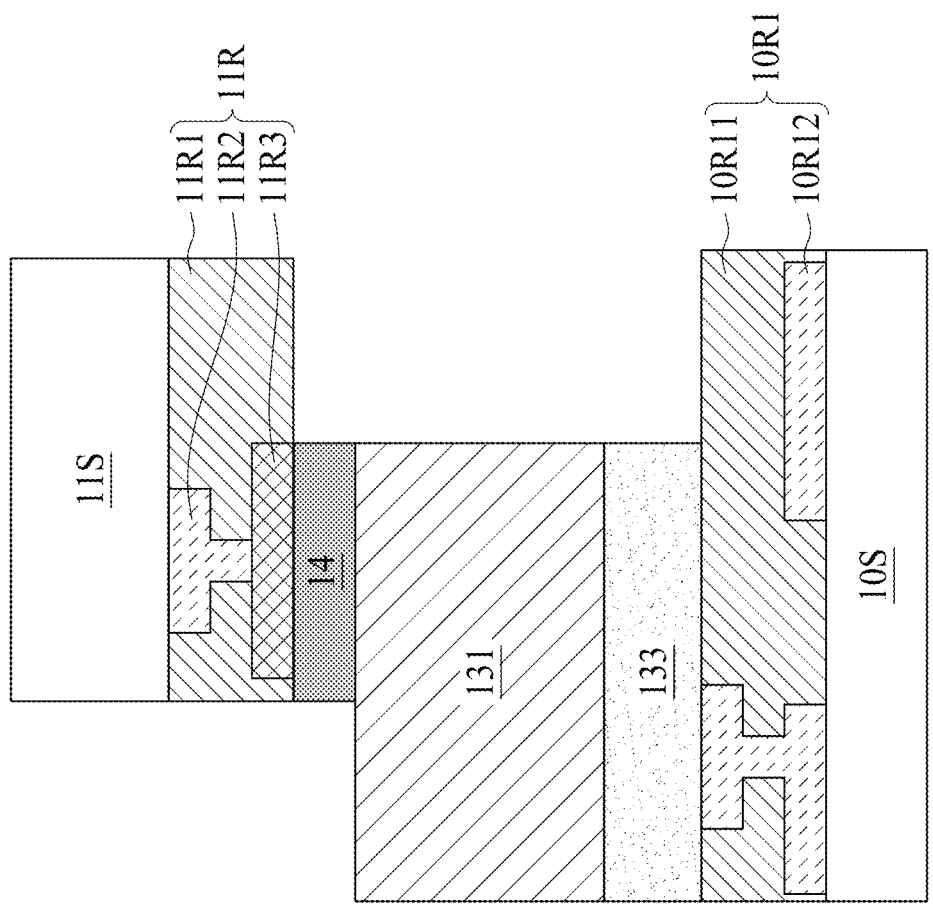
FIG. 1C is an enlarged cross-sectional view of a structure in dotted box A as shown in FIG. 1B.

FIG. 1A illustrates a top view of a semiconductor device package in accordance with some embodiments of the present disclosure, FIG. 1B illustrates a cross-sectional view of the semiconductor device package 1 along the A-A' line in FIG. 1A in accordance with some embodiments of the present disclosure and FIG. 1C is an enlarged cross-sectional view of a structure in dotted box A as shown in FIG. 1B. As shown in FIG. 1A, FIG. 1B and FIG. 1C, the semiconductor device package 1 includes at least one first die 10, a second die 11, and at least a thermal dissipation element such as a first thermal dissipation element 12.

The first die 10 (e.g. an electronic component) may include a semiconductor die, a package substrate, a fan-out substrate, an interposer or a combination thereof. The first die 10 has a first surface 101 facing toward the second die 11 and a second surface 102 opposite to the first surface 101.

In some embodiments, the first die 10 may include a substrate 10S, a first redistribution layer (RDL) 10R1, a second RDL 10R2, and a plurality of through vias 10V. The substrate 10S is disposed between the first RDL 10R1 and the second RDL 10R2. The substrate 10S may be electrically connected with the first RDL 10R1 and/or the second RDL 10R2. The substrate 10S may include, for example, a logic device, a processor, a controller (e.g. a memory controller), a microcontroller (MCU), a memory die, a high-speed input/output device or other electronic components.

The first RDL 10R1 is disposed adjacent to the first surface 101 of the first die 10. The first RDL 10R1 may include a fan-out structure. Referring to FIG. 1C, the first RDL 10R includes a dielectric layer 10R11 and one or more redistribution structures 10R12 disposed in the dielectric layer 10R11. The material of the dielectric layer 10R11 may include dielectric material(s) or insulation material(s). The redistribution structure 10R12 may include some conductive elements, for example, but is not limited to, conductive trace(s), pad(s), contact(s), via(s). The second RDL 10R2 is disposed adjacent to the second surface 102 of the first die 10. The second RDL 10R2 may include one or more redistribution structures and insulation material(s) or dielectric material(s) encapsulating the one or more redistribution structures. The second RDL 10R2 may include a fan-out structure. The redistribution structure may include some conductive elements, for example, but is not limited to, conductive trace(s), pad(s), contact(s), via(s). The plurality of through vias 10V extends through the substrate 10S. The plurality of through vias 10V is electrically connected with the first RDL 10R1 and the first RDL 10R2.

In some embodiments, a plurality of second dies 11 (e.g. a plurality of electronic components) is disposed on the first surface 101 of the first die 10. Each of the second die 11 may be smaller than the first die 10. Referring to FIG. 1A, the adjacent second dies 11 may be separated with a space (also referred to as a first space) S1 in a direction. Still referring to FIG. 1A, the adjacent second dies 11 may be separated with a space (also referred to as a second space) S2 in another direction. The length D1 of the first space S1 may be the same as or different from the length D2 of the second space S2. The plurality of second dies 11 may each include a semiconductor die, a package substrate, a fan-out substrate, an interposer or a combination thereof.

Each of the plurality of second dies 11 has a first surface 111 and a second surface 112 opposite to the first surface 111. The first surface 111 may be an inactive surface. The second surface 112 may be an active surface. In some embodiments, the first surface 111 may be, but is not limited to be, exposed. The second surface 112 faces toward the first surface 101 of the first die 10. The plurality of second dies 11 each may include a substrate 11S and a third RDL 11R electrically connected with the substrate 11S. The substrate 11S may include, for example, a logic device, a processor, a controller (e.g. a memory controller), a microcontroller (MCU), a memory die, a high-speed input/output device or other electronic components. The third RDL 11R may be disposed adjacent to the second surface 112 of the second die 11. Referring to FIG. 1C, the third RDL 11R includes a dielectric layer 11R1, a redistribution structure 11R2 within the dielectric layer 11R1, and a dummy pad 11R3 disposed on the first portion 121. The third RDL 11R may include a fan-out structure. The material of the dielectric layer 11R1 may include dielectric material(s) or insulation material(s). The redistribution structure 11R2 may include some conductive elements, for example, but is not limited to, conductive trace(s), pad(s), contact(s), via(s). The dummy pad 11R3 may include conductive material(s).

In some embodiments, the dummy pad 11R3 may have a floating voltage. For example, the dummy pad 11R3 is not electrically connected to the substrate 11S of the second die 11. In some embodiments, the first thermal dissipation element 12 is electrically floated from the second die 11. In other words, the first thermal dissipation element 12 does not transmit electrical signals from the first die 10 or the second die 11.

The first thermal dissipation element 12 is disposed on the first surface 101 of the first die 10. The first thermal dissipation element 12 is configured to help the heat dissipation for the first die 10 and the second die 11. The material of the first thermal dissipation element 12 may have a thermal conductivity higher than that of polymer, semiconductor material, or molding compound, such that the first thermal dissipation element 12 can improve efficiency of thermal conduction. Examples of the material of the first thermal dissipation element 12 may include metal such as copper (Cu), gold (Au), aluminum (Al) or the like. Furthermore, the first thermal dissipation element 12 may include a pre-formed structure. The pre-formed structure is formed before being disposed on the first die 10. The pre-formed structure may be formed by, for example, forging, molding, or shaping in one or more preliminary processes.

The first thermal dissipation element 12 includes a first portion 121 disposed between the first die 10 and the second die 11. The first portion 121 extends in a first direction L1 substantially parallel to the first surface 101. The first portion 121 has a first width W1 greater than the length D1 of the first space S1 between two adjacent second dies 11. The first portion 121 is partially covered by at least one of the plurality of second dies 11. The covered section of the first portion 121 is denoted with the dotted line in FIG. 1A. The first portion 121 may be partially covered by borders of at least one of the plurality of second dies 11. The first portion 121 may be partially covered by corners of at least one of the plurality of second dies 11. The first thermal dissipation element 12 further includes a second portion 122 disposed on the first portion 121. In some embodiments, the second portion 122 may be connected to the first portion 121. The second portion 122 extends in a second direction L2 substantially perpendicular to the first surface 101. The second portion 122 has a second width W2 less than the first length D1. The second portion 122 extends to be adjacent to an edge 113 of the second die 11. In some embodiments, the second portion 122 is disposed between two adjacent second dies 11. In some embodiments, the second portion 122 is unequally spaced from the two adjacent second dies 11. In some embodiments, a top surface of the second portion 122 and the first surface 111 of one or more of second dies 11 are substantially coplanar.

In some embodiments, the semiconductor device package 1 may further include a thermal conductive layer 123 disposed between the second portion 122 and the first RDL 10R1 of the first die 10. The thermal conductive layer 123 may be in contact with the first RDL 10R1. In some embodiments, the first RDL 10R1 can be omitted, so the thermal conductive layer 123 is in contact with the substrate 10S of the first die 10. The thermal conductive layer 123 may include thermal interface material(s) (TIM) such as thermal greases, gels, putties, and pastes. In some embodiments, the thermal conductive layer 123 may include one of tungsten (W), titanium (Ti), Tantalum (Ta) or the compound thereof.

In some embodiments, the semiconductor device package 1 may further includes a pre-solder 14. The pre-solder 14 is disposed between the first portion 121 and the second surface 112 of the second die 11. In some embodiments, the pre-solder 14 may be in contact with the first portion 121 or the second surface 112. The pre-solder 14 may work as an interface between the first thermal dissipation element 12 and the second die 11 and may, therefore, facilitate the thermal dissipation from the second die 11 to the first thermal dissipation element 12. In some embodiments, the pre-solder 14 may protrude from the side surface of the first portion 121. In some embodiments, the pre-solder 14 may be in contact with the second portion 122. The pre-solder 14 may include, for example but is not limited to, solder, adhesive (which may include a conductive adhesive (e.g. resin mixed with conductive particles)), or other suitable bonding material(s).

In some embodiments, the semiconductor device package 1 may further include a connection structure 13. The connection structure 13 may be disposed between the first surface 101 and the second surface 112. The connection structure 13 is electrically conductive. The connection structure 13 may electrically connect the first die 10 to one or more of the plurality of second dies 11. The connection structure 13 may be in contact with the first RDL 10R1 of the first die 10. The connection structure 13 may be in contact with the third RDL 11R of the second die 11. In some embodiments, the connection structure 13 may be thermally conductive. Referring to FIG. 1B, the connection structure 13 has a height H1 in the second direction L2. The height H1 may substantially equal to a distance between the first die 10 and the second die 11. The height H1 of the conductive structure 13 is higher than a height H2 of the first portion 121 in the second direction L2.

The connection structure 13 may include a first conductive pad 131, a connection element 132 and a second conductive pad 133. The first conductive pad 131 is disposed on the second surface 112 of the second die 11. The second conductive pad 133 is disposed on the first surface 101 of the first die 10. The connection element 132 is disposed between the first conductive pad 131 and the second conductive pad 133. The first conductive pad 131 and the second conductive pad 133 may each include conductive material(s). The first conductive pad 131 and the second conductive pad 133 may each include a metal such as copper (Cu), gold (Au), aluminum (Al) or the like. The connection element 132 may include, for example but is not limited to, solder, adhesive (which may include a conductive adhesive (e.g. resin mixed with conductive particles)), or other suitable bonding material(s).

The semiconductor device package 1 may further include an electrical contact 15 disposed on the second surface 102 of the first die 10 to build external electrical connection. By way of example, the first die 10 may be further electrically connected to a stacking structure including a substrate or a printed circuit board (PCB) through the electrical contact 15. The electrical contact 15 may include a solder ball or a solder bump. In some embodiments, the electrical contact 15 may include a controlled collapse chip connection (C4) bump, a ball grid array (BGA) or a land grid array (LGA).

As shown in FIG. 1B, a first thermal conductive path TP1 is established among the second die 11, the connection structure 13, the first die 10, the electrical contact 15 and the external stacking structure connected with the electrical contact 15. The external stacking structure may include multiple semiconductor dies stacked on a PCB. The first thermal conductive path TP1 inevitably passes through the dielectric material with small thermal conductivity in first die 10 and the external stacking structure. Subsequently, the heat generated from the active surface of the second die 11, i.e., the second surface 112, cannot be efficiently transferred to the external environment through the first die 10 and the external stacking structure.

Still referring to FIG. 1B, the first portion 121 has the first width W1 greater than the second width W2 of the second portion 122, such that the first portion 121 and the second portion 122 form a reverse-T-shape-like structure. The first portion 121 with the first width W1 greater than the first distance D1 may be in contact with the second die 11 via the pre-solder 14. The second portion 122 with the second width W2 less than the first distance D1 may extend adjacent to the edge 113 of the second die and be in contact with an external element, for example, a thermal sink (also referred to a heat sink). A second thermal conductive path TP2 is established among the second die 11, the pre-solder 14, the first thermal dissipation element 12, and the external element. Since the second thermal conductive path TP2 bypasses the first die 10 and the external stacking structure, the second thermal conductive path TP2 is shorter than the first thermal conductive path TP1. Furthermore, the second thermal conductive path TP2 passes through the material with relatively high thermal conductivity than the dielectric material through which the first thermal conductive path TP1 passes. As a result, the second thermal conductive path TP2 provides a more efficient thermal dissipation for the active surface of the second die 11, i.e., the second surface 112, than the first thermal conductive path TP1.

Figure 2A:
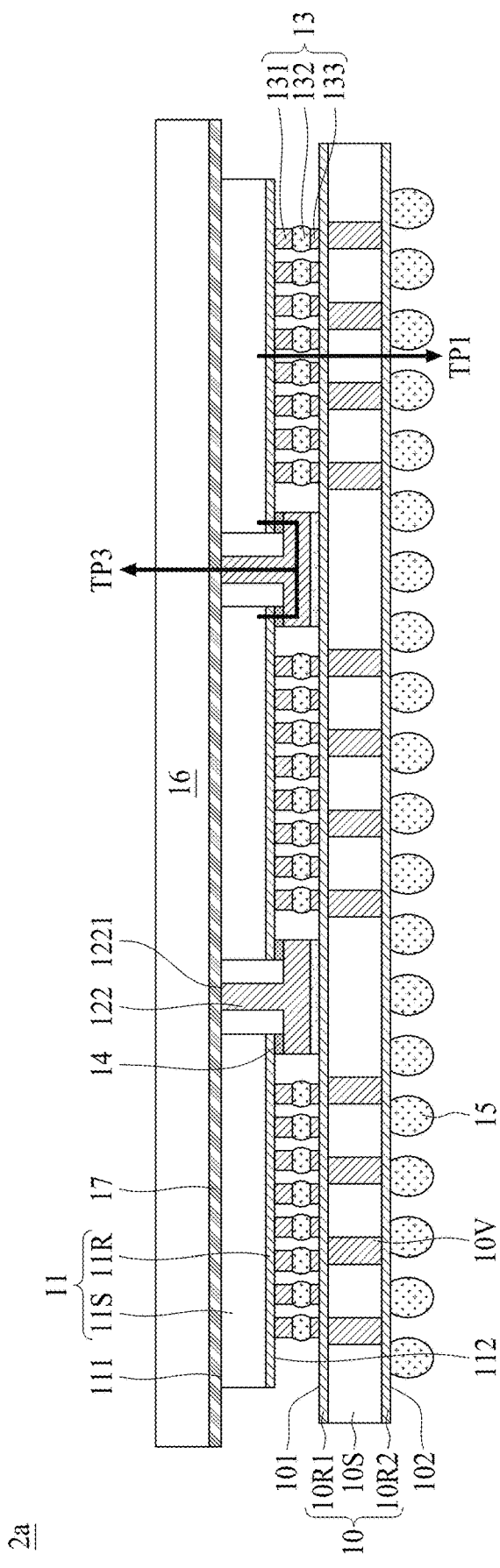
FIG. 2A illustrates a cross-sectional view of a semiconductor device package in accordance with some embodiments of the present disclosure.

FIG. 2A illustrates a cross-sectional view of a semiconductor device package 2a in accordance with some embodiments of the present disclosure. The semiconductor device package 2a of FIG. 2A is similar to the semiconductor device package 1 of FIG. 1B and the differences therebetween are described below.

The semiconductor device package 2a further includes a thermal sink 16 and an adhesive layer 17 disposed between the thermal sink 16 and the first surface 111 of one or more of the plurality of second dies 11. The thermal sink 16 may include a planar bottom profile. The thermal sink 16 is disposed on the second portion 122 of the first thermal dissipation element 12. The thermal sink 16 may be, for example, a pipe, a fin-type heat sink, a planar heat sink, a liquid cooling tube, or a thermal vapor compressor (TVC). The adhesive layer 17 may include TIM(s) such that the thermal dissipation between the thermal sink 16 and the second portion 122 can be improved. A third thermal conductive path TP3 is established among the second die 11, the pre-solder 14, the first thermal dissipation element 12, the adhesive layer 17, and the thermal sink 16. Since the third thermal conductive path TP3 bypasses the external stacking structure, the third thermal conductive path TP3 is shorter than the first thermal conductive path TP1. Furthermore, the third thermal conductive path TP3 passes through the material with relatively high thermal conductivity than the dielectric material through which the first thermal conductive path TP1 passes. As a result, the third thermal conductive path TP3 provides a more efficient thermal dissipation for the active surface the plurality of second dies 11, i.e., the surface 112, than the first thermal conductive path TP1.

In some embodiments, the adhesive layer 17 may be omitted and the thermal sink 16 is in contact with the second portion 122 or the first surface 111 of one or more of the plurality of second dies 11.

Figure 2B:
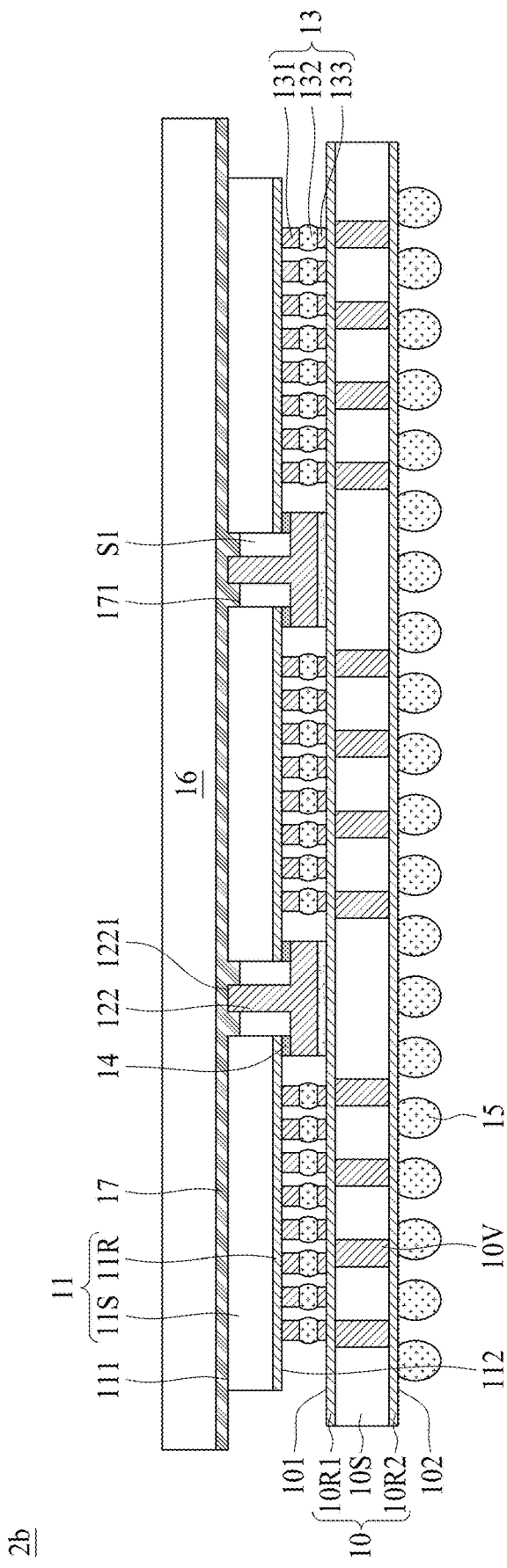
FIG. 2B illustrates a cross-sectional view of a semiconductor device package in accordance with some embodiments of the present disclosure.

FIG. 2B illustrates a cross-sectional view of a semiconductor device package 2b in accordance with some embodiments of the present disclosure. The semiconductor device package 2b of FIG. 2B is similar to the semiconductor device package 2a of FIG. 2A and the differences therebetween are described below. The adhesive layer 17 includes an extending portion 171 at least partially disposed in the first space S1 between the two adjacent second dies 11. The adhesive layer 17 may include flexible material(s). The extending portion 171 may be formed when a portion of the adhesive layer 17 flows into the first space during a mounting process of the thermal sink 16.

Figure 2C:
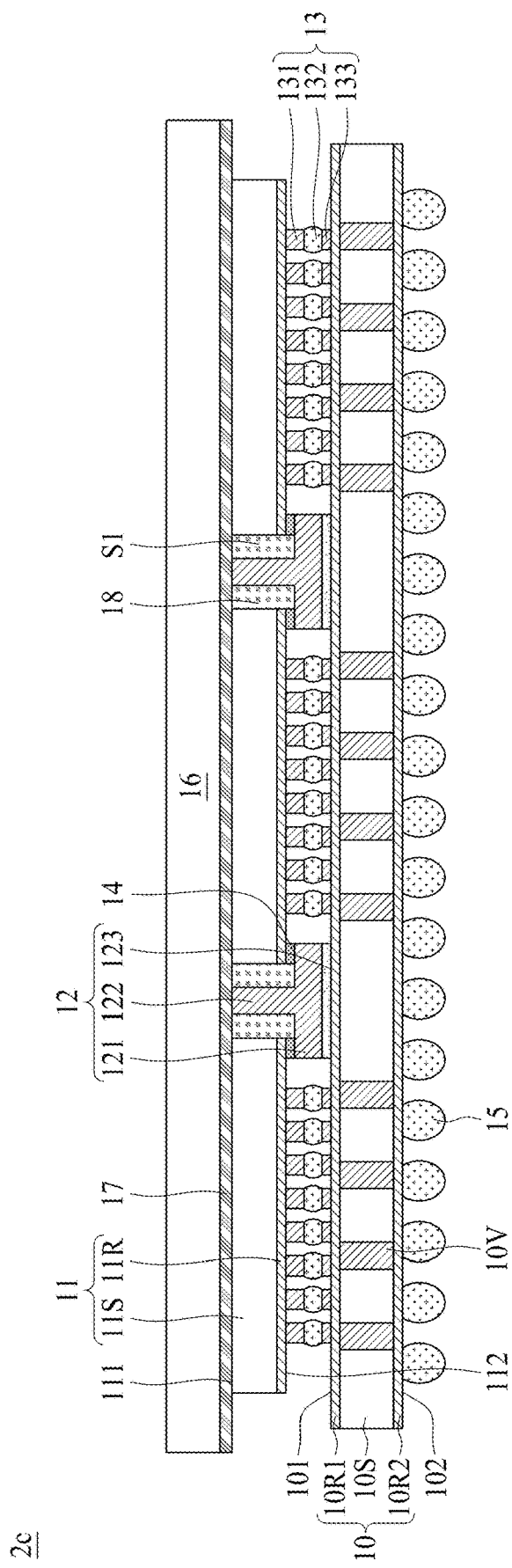
FIG. 2C illustrates a cross-sectional view of a semiconductor device package in accordance with some embodiments of the present disclosure.

FIG. 2C illustrates a cross-sectional view of a semiconductor device package 2c in accordance with some embodiments of the present disclosure. The semiconductor device package 2c of FIG. 2C is similar to the semiconductor device package 2a of FIG. 2A and the differences therebetween are described below. The semiconductor device package 2c further includes a molding compound 18 disposed in the first space S1. The molding compound 18 surrounds the second portion 122 of the first thermal dissipation element 12. The molding compound 18 may be in contact with the first thermal dissipation element 12. In some embodiments, the molding compound 18 may partially or entirely fill an enclosing area defined by the adjacent second dies 11, first thermal dissipation element 12, pre-solder 14, and the adhesive layer 17.

Figure 2D:
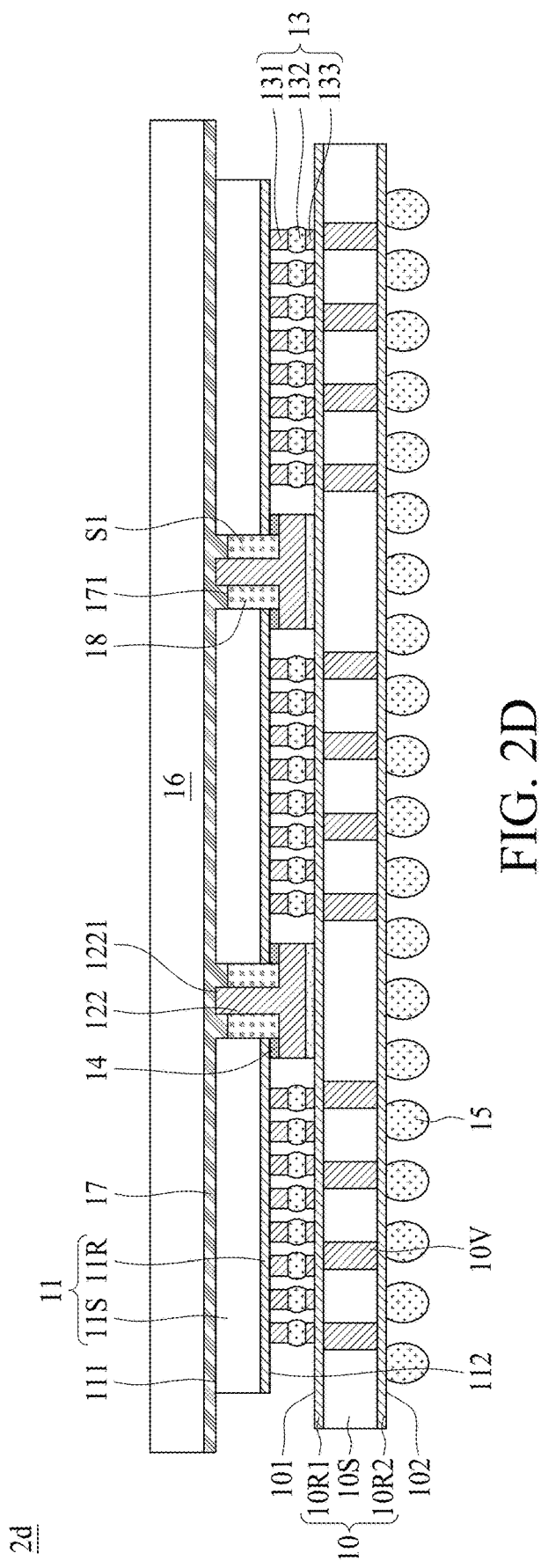
FIG. 2D illustrates a cross-sectional view of a semiconductor device package in accordance with some embodiments of the present disclosure.

FIG. 2D illustrates a cross-sectional view of a semiconductor device package 2d in accordance with some embodiments of the present disclosure. The semiconductor device package 2d of FIG. 2D is similar to the semiconductor device package 2c of FIG. 2C and the differences therebetween are described below. The molding compound 18 may partially or entirely fill an enclosing area defined by the adjacent second dies 11, first thermal dissipation element 12, pre-solder 14, and the extending portion 171 of the adhesive layer 17.

Figure 2E:
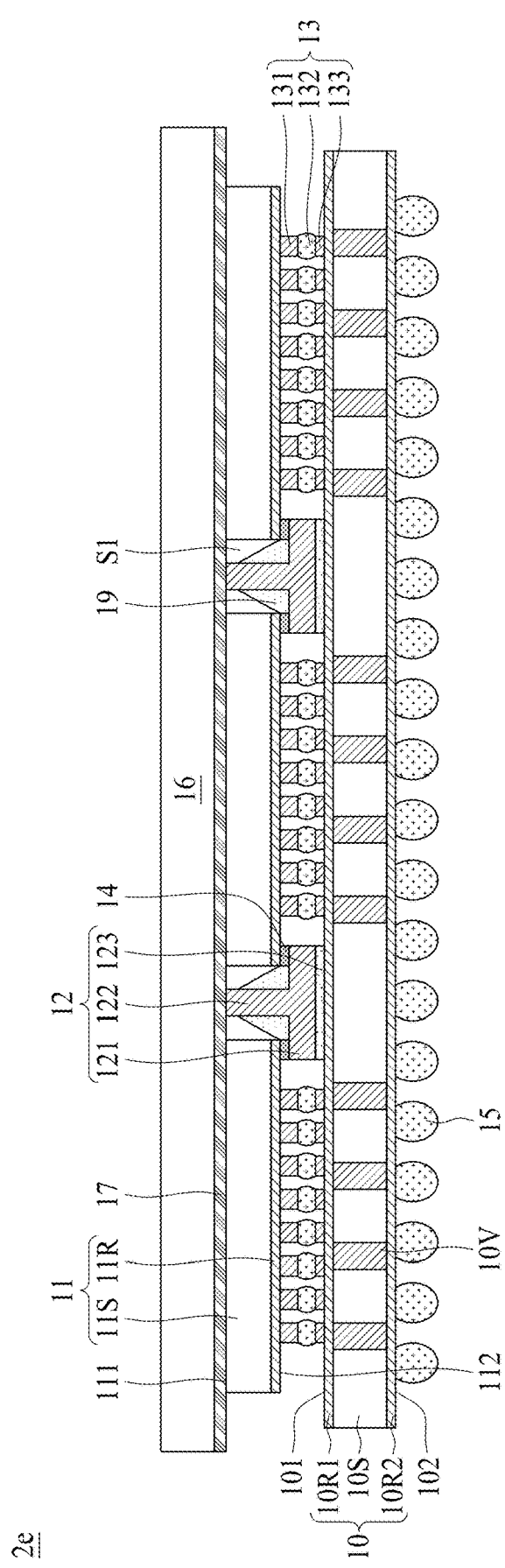
FIG. 2E illustrates a cross-sectional view of a semiconductor device package in accordance with some embodiments of the present disclosure.

FIG. 2E illustrates a cross-sectional view of a semiconductor device package 2e in accordance with some embodiments of the present disclosure. The semiconductor device package 2e of FIG. 2E is similar to the semiconductor device package 2a of FIG. 2A and the differences therebetween are described below. The semiconductor device package 2e further includes an underfill 19 disposed in the first space S1. The underfill 19 may be spaced apart from the adhesive layer 17. The underfill 19 may be in contact with first thermal dissipation element 12 or pre-solder 14. The underfill 19 has a tapered profile. The underfill 19 may include an epoxy resin, a polyimide, a phenolic compound or material, a material including a silicone dispersed therein, or a combination thereof.

Figure 2F:
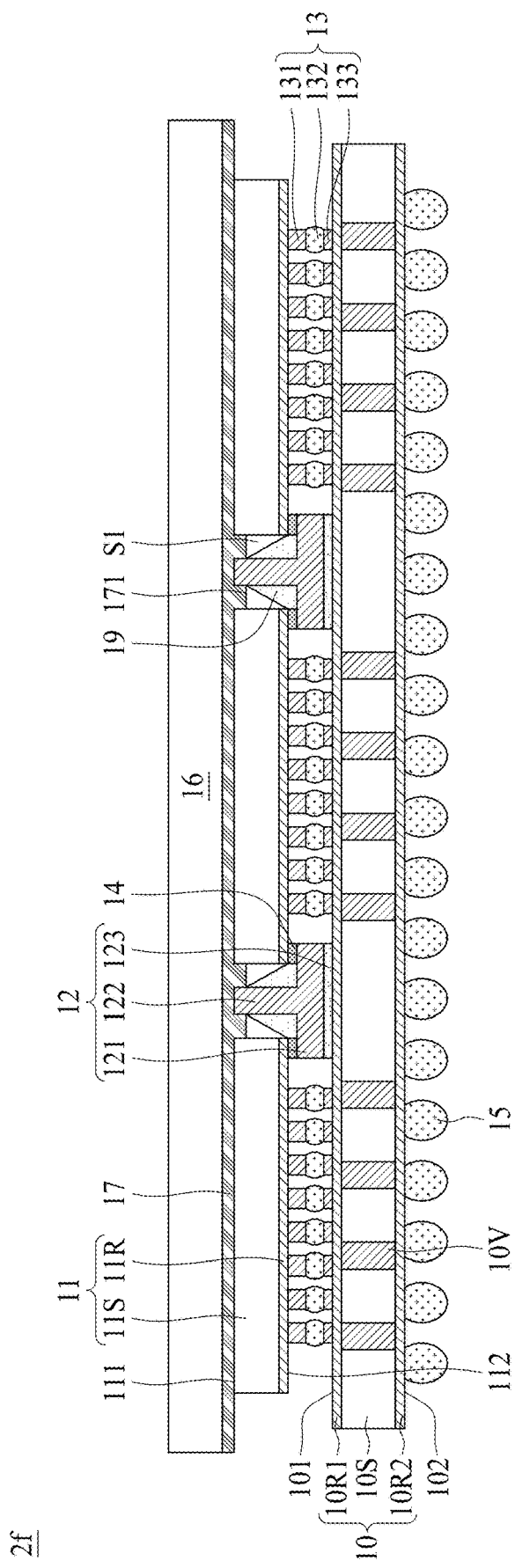
FIG. 2F illustrates a cross-sectional view of a semiconductor device package in accordance with some embodiments of the present disclosure.

FIG. 2F illustrates a cross-sectional view of a semiconductor device package 2f in accordance with some embodiments of the present disclosure. The semiconductor device package 2f of FIG. 2F is similar to the semiconductor device package 2b of FIG. 2B and the differences therebetween are described below. The semiconductor device package 2f further includes an underfill 19 partially disposed in the first space S1. The underfill 19 may be in contact with the extending portion 171 of the adhesive layer 17.

Figure 2G:
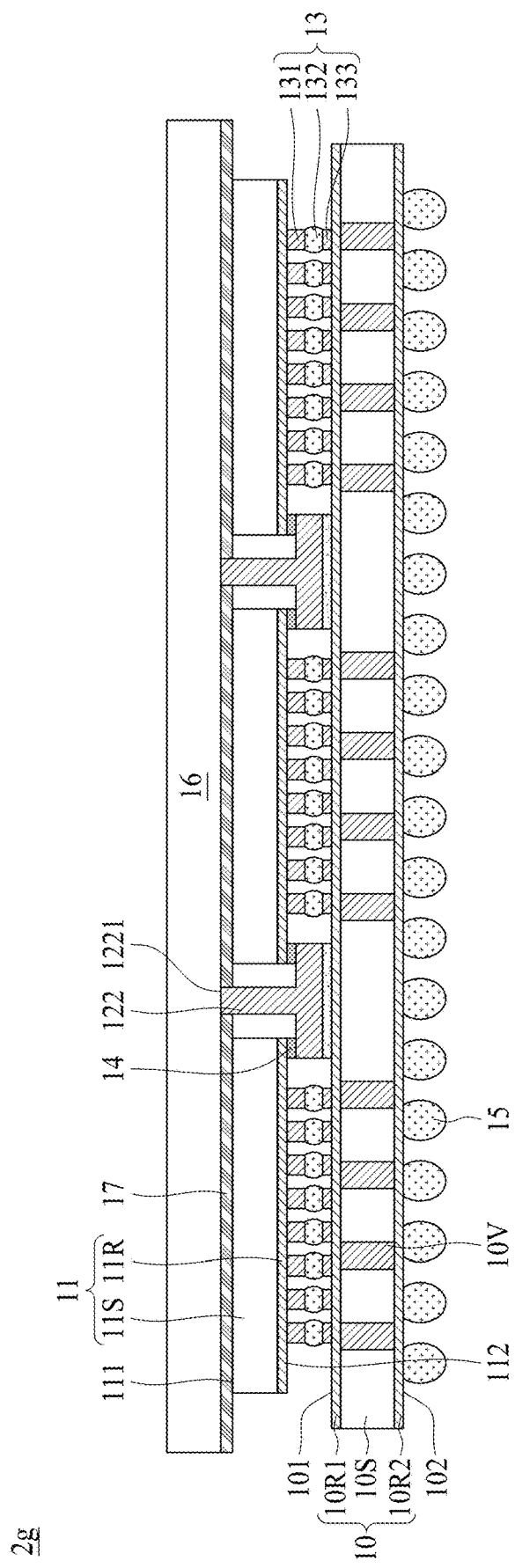
FIG. 2G illustrates a cross-sectional view of a semiconductor device package in accordance with some embodiments of the present disclosure.

FIG. 2G illustrates a cross-sectional view of a semiconductor device package 2g in accordance with some embodiments of the present disclosure. The semiconductor device package 2g of FIG. 2G is similar to the semiconductor device package 2a of FIG. 2A and the differences therebetween are described below. The second portion 122 of the first thermal dissipation element 12 of the semiconductor device package 2g has a top surface 1221 in contact with the thermal sink 16. The top surface 1221 may be higher than the first surface 111 of the plurality of second dies 11.

Figure 3A:
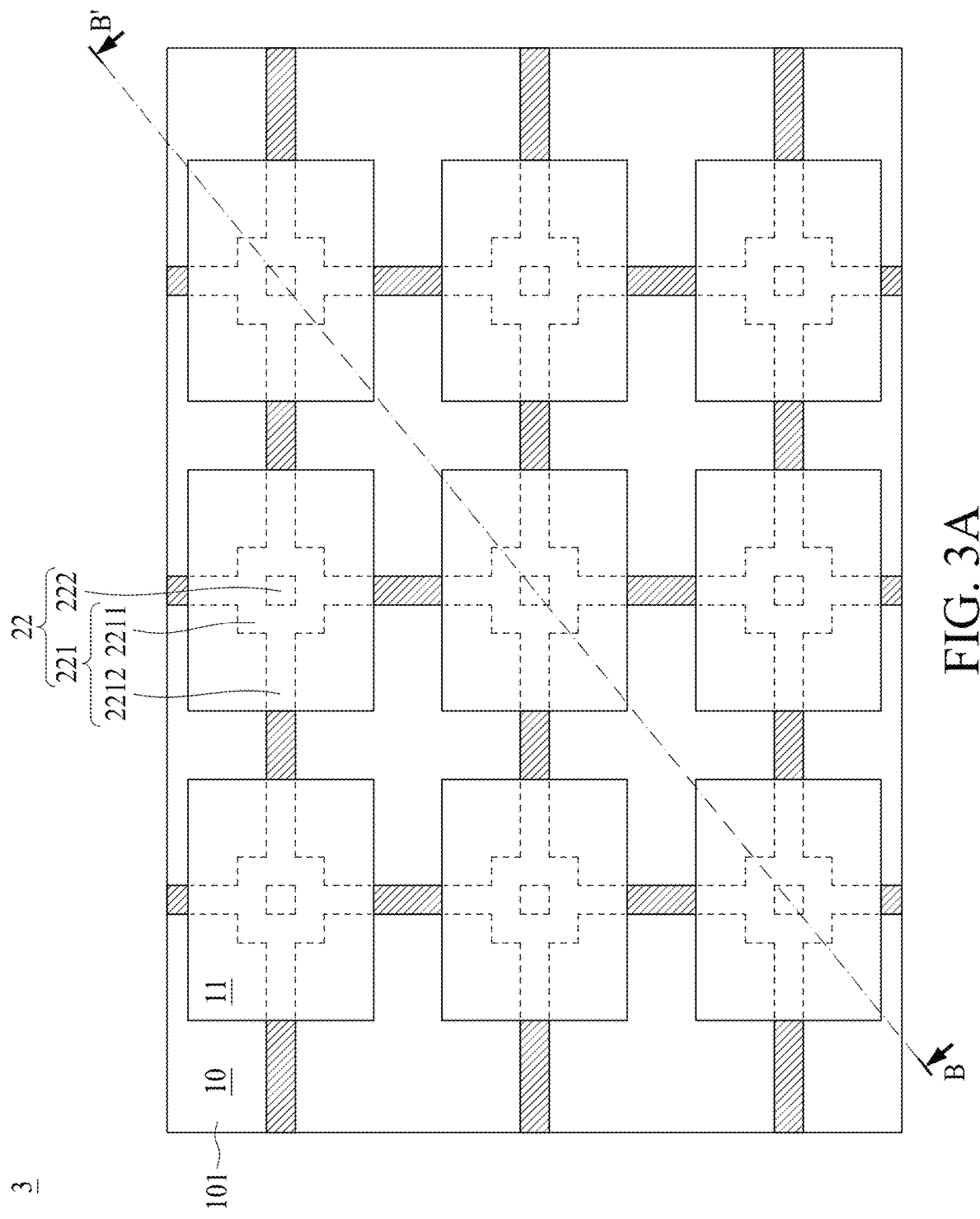
FIG. 3A illustrates a top view of a semiconductor device package in accordance with some embodiments of the present disclosure.
Figure 3B:
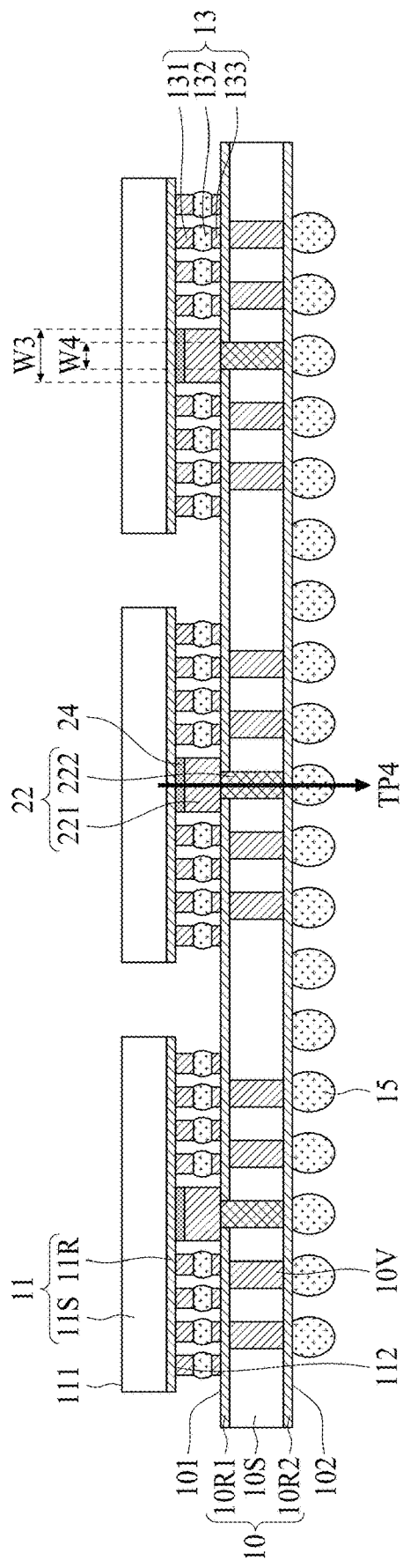
FIG. 3B illustrates a cross-sectional view of the semiconductor device package along the B-B' line in FIG. 3A in accordance with some embodiments of the present disclosure.

FIG. 3A illustrates a top view of a semiconductor device package 3 in accordance with some embodiments of the present disclosure and FIG. 3B illustrates a cross-sectional view of the semiconductor device package 3 along the B-B' line in FIG. 3A in accordance with some embodiments of the present disclosure. As shown in FIG. 3A and FIG. 3B, the semiconductor device package 3 is similar to the semiconductor device package 1 and the differences therebetween are described below. The semiconductor device package 3 includes at least one first die 10, at least one second die 11, and a second thermal dissipation element 22 instead of a first thermal dissipation element 12. The second thermal dissipation element 22 includes a first portion 221 and a second portion 222. The second portion 222 may be connected to the first portion 221. The first portion disposed between the first die 10 and the second die 11. The first portion 221 is partially covered by one of the plurality of second dies 11. The covered section of the first portion 221 is denoted with the dotted line in FIG. 3A. The first portion 221 has a wide region 2211 disposed on and substantially aligned with the second portion 222. The wide region 2211 may include a rectangular-shape structure. The first portion 221 has a narrow region 2212 connected with another narrow region 2212 of another first portion 221. The wide region 2211 may have a width greater than the narrow region 2212.

Referring to FIG. 3B, the second portion 222 of the second thermal dissipation element 22 is disposed in the first die 10. The second portion 222 extends through the first RDL 10R1 and the substrate 10S. In some embodiments, the second portion 222 may extend through the second RDL 10R2. In some embodiments, the second portion 222 may extend through the first die 10 from the first surface 101 to the second surface 102.

Still referring to FIG. 3B, the first portion 221 has the third width W3 greater than the fourth width W4 of the second portion 222, such that the first portion 221 and the second portion 222 form a T-shape-like structure.

The second thermal dissipation element 22 is configured to help the heat dissipation for the first die 10 and the second die 11. The material of the second thermal dissipation element 22 may have a thermal conductivity higher than that of polymer, semiconductor material, or molding compound, such that the second thermal dissipation element 22 can improve efficiency of thermal conduction. The second thermal dissipation element 22 may include a metal such as copper (Cu), gold (Au), aluminum (Al) or the like. Furthermore, the second thermal dissipation element 22 may include a pre-formed structure. The pre-formed structure is formed before being disposed on the first die 10. The pre-formed structure may be formed by, for example, forging, molding, or shaping in one or more preliminary processes.

In some embodiments, the semiconductor device package 3 may further include a pre-solder 24 disposed between the first portion 221 and the second surface 112 of the second die 11. In some embodiments, the pre-solder 24 may be in contact with the first portion 221 or the second surface 112. The pre-solder 24 may include, for example but is not limited to, solder, adhesive (which may include a conductive adhesive (e.g. resin mixed with conductive particles)), or other suitable bonding material(s).

In some embodiments, the pre-solder 24 may works as an interface between the second thermal dissipation element 22 and the second die 11 and may, therefore, facilitate the thermal dissipation from the second die 11 to the second thermal dissipation element 22. The second thermal dissipation element 22 and the electrical contact 15 may be in contact with the second RDL 10R2. A fourth thermal conductive path TP4 is established among the second die 11, the second thermal dissipation element 22, the second RDL 10R2, the electrical contact 15, and the external stacking structure connected with the electrical contact 15. Since the fourth thermal conductive path TP4 passes through materials with relatively high thermal conductivity than the dielectric material through which the first thermal conductive path TP1 passes. As a result, the fourth thermal conductive path TP4 provides a more efficient thermal dissipation for the active surface of the second die 11, i.e., the second surface 112, than the first thermal conductive path TP1.

Furthermore, the second thermal dissipation element 22 is electrically floated from the plurality of through vias 10V. The second thermal dissipation element 22 is electrically isolated from the plurality of through vias 10V. The second thermal dissipation element 22 is electrically floated from the first die 10 or the second die 11. The second thermal dissipation element 22 does not transmit electrical signals from the first die 10 or the second die 11.

Figure 4A:
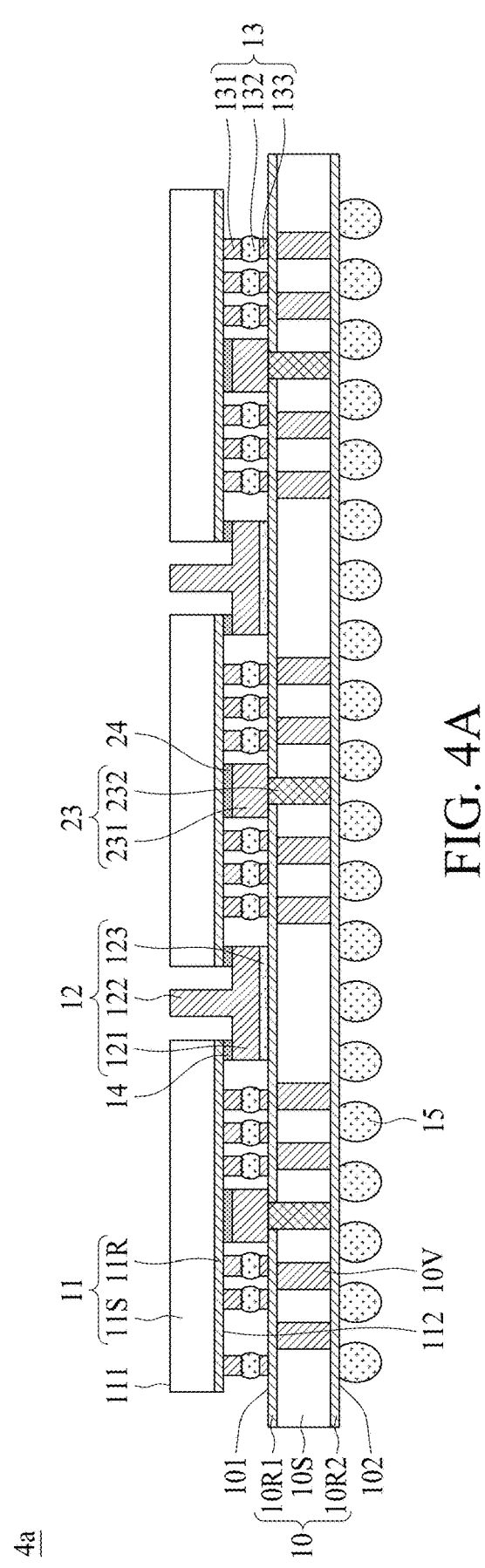
FIG. 4A illustrates a cross-sectional view of a semiconductor device package in accordance with some embodiments of the present disclosure.

FIG. 4A illustrates a cross-sectional view of a semiconductor device package 4a in accordance with some embodiments of the present disclosure. The semiconductor device package 4a of FIG. 4A is similar to the semiconductor device package 1 of FIG. 1B and the differences therebetween are described below. The semiconductor device package 4a includes both the first thermal dissipation element 12 and the second thermal dissipation element 22. Therefore, the semiconductor device package 4a has at least one of the thermal conductive paths TP1, TP2, and TP4 to dissipate the heat generated from the plurality of second dies 11.

Figure 4B:
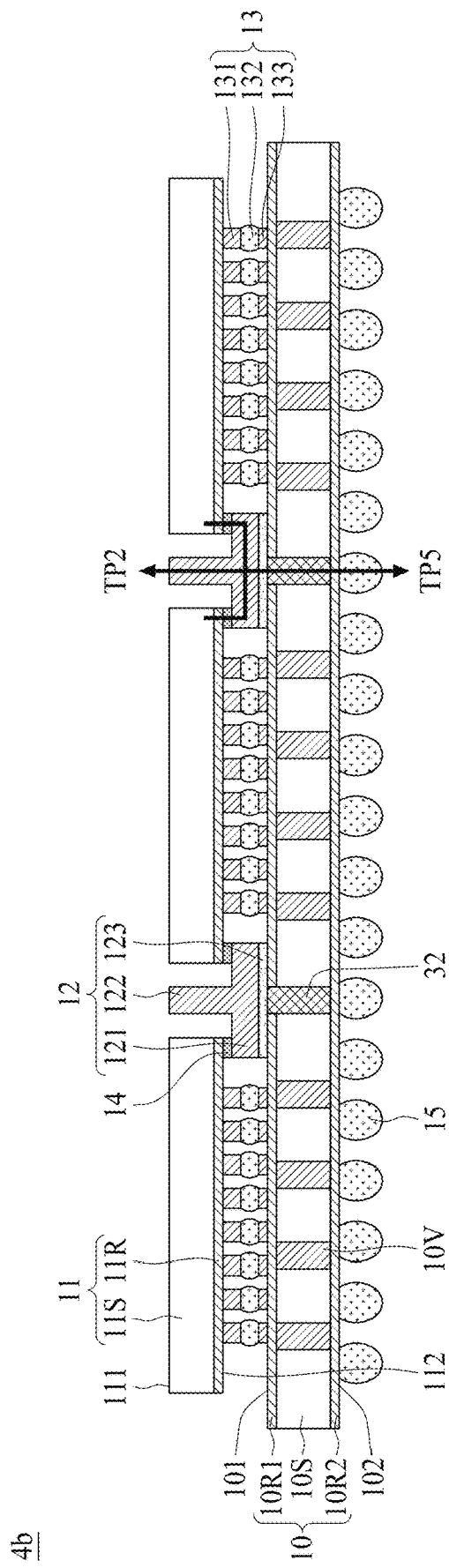
FIG. 4B illustrates a cross-sectional view of a semiconductor device package in accordance with some embodiments of the present disclosure.

FIG. 4B illustrates a cross-sectional view of a semiconductor device package in accordance with some embodiments of the present disclosure. The semiconductor device package 4b of FIG. 4B is similar to the semiconductor device package 1 of FIG. 1B and the differences therebetween are described below. The semiconductor device package 4b includes a third thermal dissipation element 32 disposed below the first thermal dissipation element 12. The third thermal dissipation element 32 may be in contact with the thermal conductive layer 123. The third thermal dissipation element 32 may be similar or the same as the second portion 222 of the second thermal dissipation element 22. In addition to the second thermal conductive path TP2, a fifth thermal conductive path TP5 is established among the second die 11, the first portion 121 and thermal conductive layer 123 of the first thermal dissipation element 12, the third thermal dissipation element 32, the second RDL 10R2, the electrical contact 15, and the external stacking structure connected to the electrical contact 15.

FIG. 5A, FIG. 5B, FIG. 5C, FIG. 5D, FIG. 5E, FIG. 5F, FIG. 5G, FIG. 5H, FIG. 5I and FIG. 5J illustrate one or more stages of a method for manufacturing a semiconductor device package in accordance with some embodiments of the subject application.

Figure 5A:
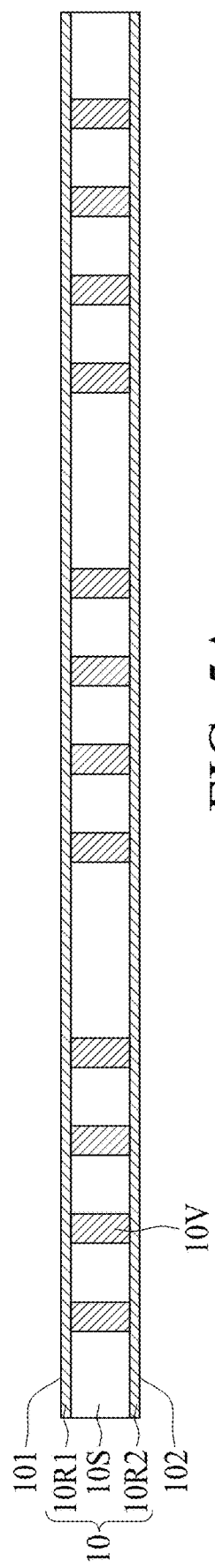
FIG. 5A, FIG. 5B, FIG. 5C, FIG. 5D, FIG. 5E, FIG. 5F, FIG. 5G, FIG. 5H, FIG. 5I and FIG. 5J illustrate one or more stages of a method for manufacturing a semiconductor device package in accordance with some embodiments of the subject application.

Referring to FIG. 5A, a first die 10 having a first surface 101 and a second surface 102 is provided. The first die 10 includes a substrate 10S, a first RDL 10R1 adjacent to the first surface 101, a second RDL 10R2 adjacent to the second surface 102, and a plurality of through vias 10V extending through the substrate 10S.

Figure 5B:
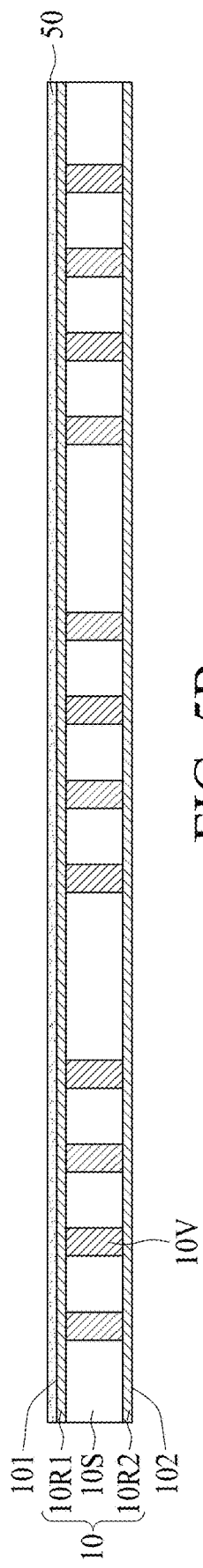
Figure 5C:
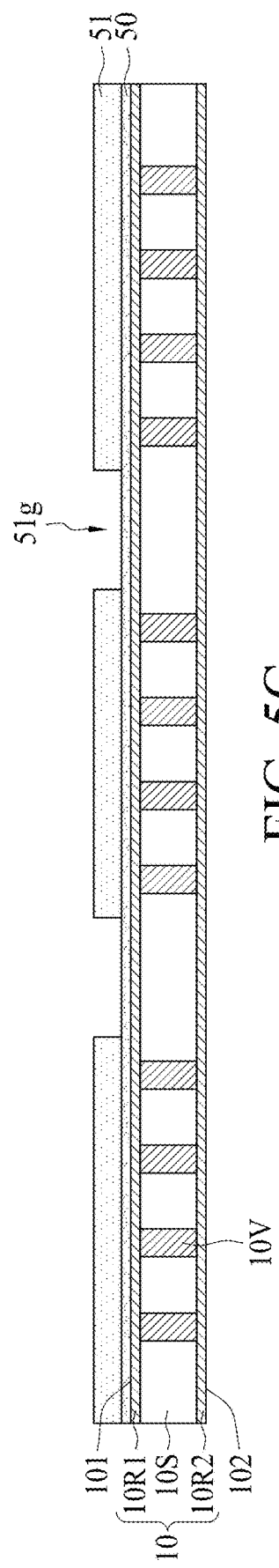
Figure 5D:
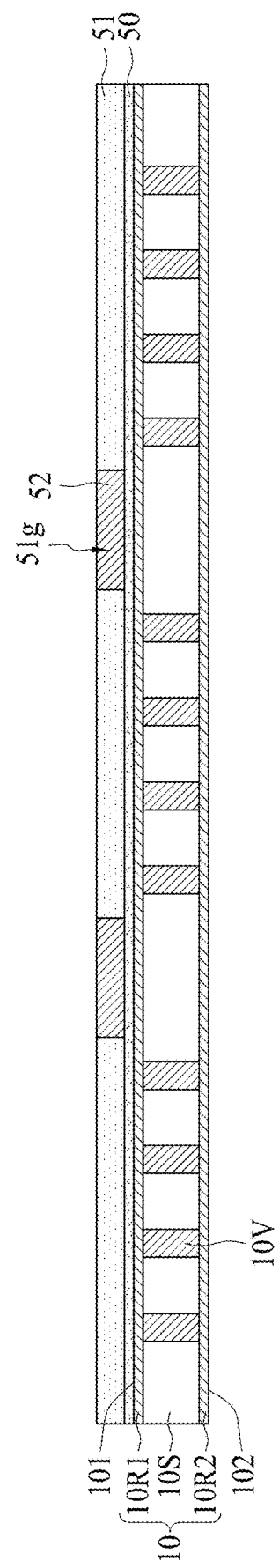

Referring to FIG. 5B, a bulk seed layer 50 is formed on the first surface 101 of the first die 10. Referring to FIG. 5C, a first photoresist layer 51 is formed on the bulk seed layer 50 by, for example, a coating process followed by an exposure process. The first photoresist layer 51 defines a gap 51g on the bulk seed layer 50. Referring to FIG. 5D, a first thermal conductive material 52 is formed within the gap 51g by, for example, an electroplating process. The first thermal conductive material 52 may include a metal such as copper (Cu), gold (Au), aluminum (Al) or the like.

Figure 5E:
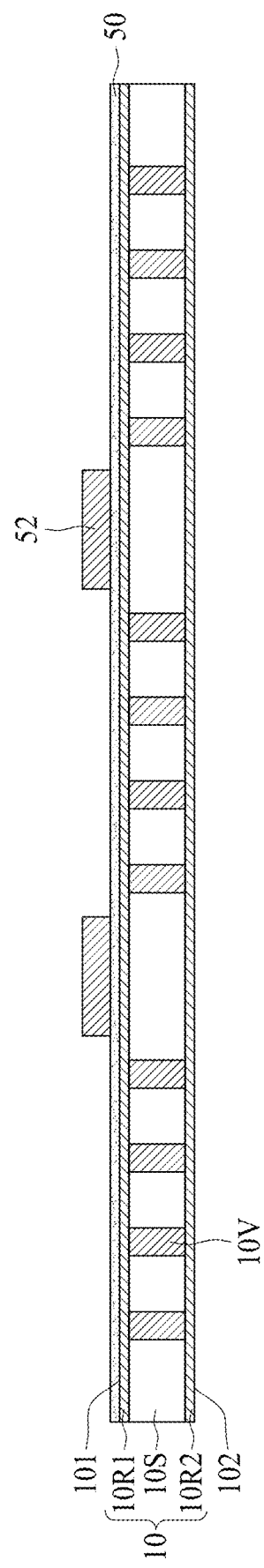
Figure 5F:
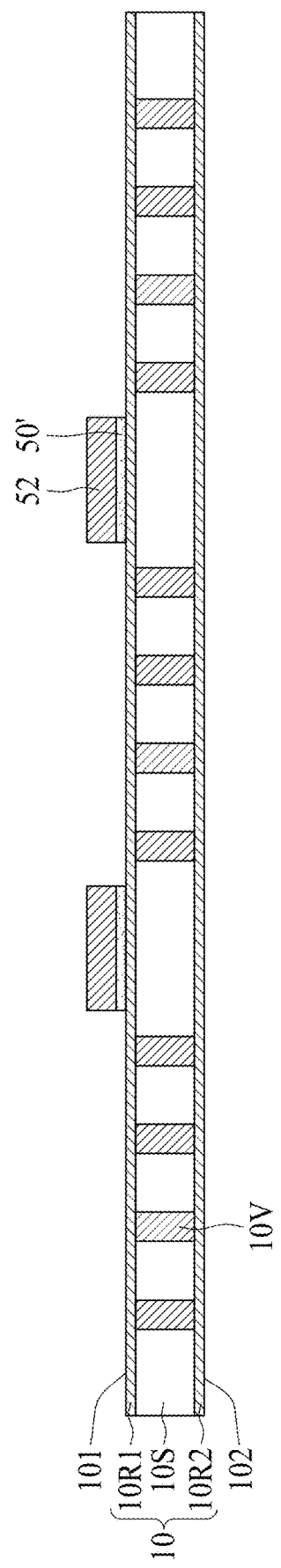

Referring to FIG. 5E, the first photoresist layer 51 is removed by, for example, a plasma ashing process. Referring to FIG. 5F, a portion of the bulk seed layer 50 exposed from the first thermal conductive material 52 is removed in the etching process to form a seed layer 50'.

Figure 5G:
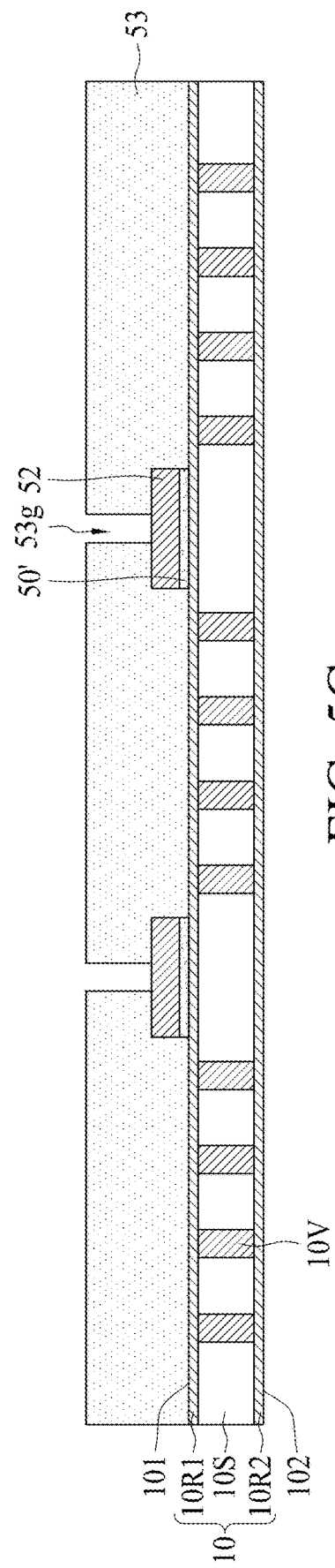
Figure 5H:
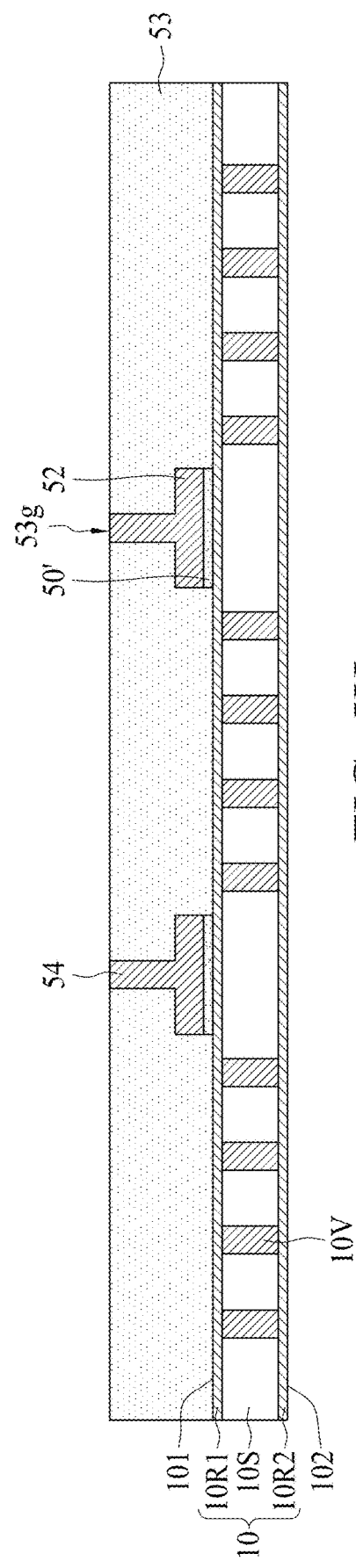
Figure 5I:
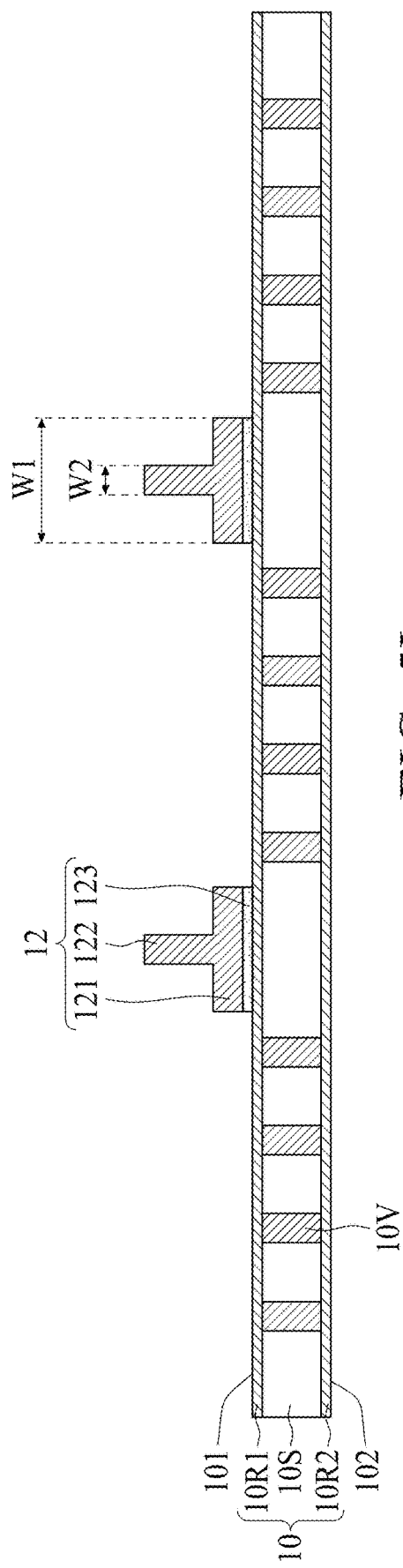

Referring to FIG. 5G, a second photoresist layer 53 is formed on the thermal first conductive material 52 and the first surface 101 of the first die 10 by, for example, a coating process followed by an exposure process. The second photoresist layer 53 defines a gap 53g on the first thermal conductive material 52. Referring to FIG. 5H, a second thermal conductive material 54 is formed within the gap 53g by, for example, an electroplating process. The second thermal conductive material 54 may include a metal such as copper (Cu), gold (Au), aluminum (Al) or the like. Referring to FIG. 5I, the second photoresist layer 53 is removed by, for example, a plasma ashing process. Subsequently, the thermal conductive materials 52 and 54 and the seed layer 50' form a first thermal dissipation element 12 as described in FIG. 1B. A first portion 121 of the first thermal dissipation element 12 has a first width W1 greater than a second width W2 of a second portion 122 of the first thermal dissipation element 12.

Figure 5J:
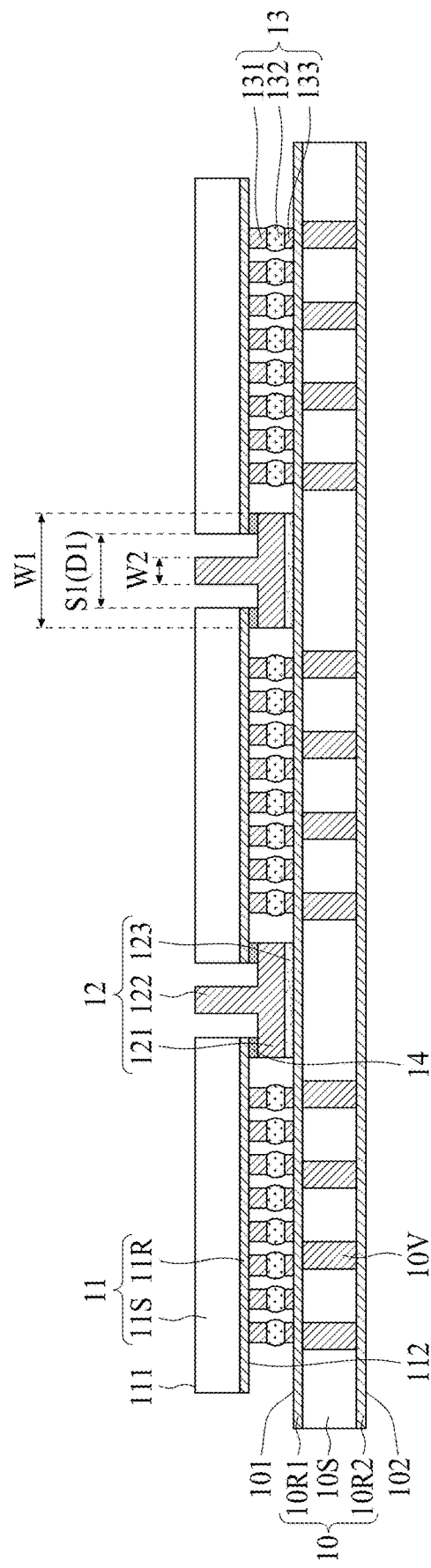

Referring to FIG. 5J, at least one second die 11 is attached to the first surface 101 of the first die 10 via a plurality of connection structure 13. A pre-solder 14 may be formed on the first portion 121 or a surface 112 of the at least one second dies 11 before the attachment process of the plurality of second dies 11. The plurality of second dies 11 are separated from each other with a first space S1. The first space S1 has a first distance D1 less than the first width W1. Meanwhile, the first distance D1 is greater than the second width W2.

Furthermore, an electrical contact 15 may be formed on the second surface 102 of the first die 10 and a singulation operation may be performed to form some semiconductor device package 1 described and illustrated in FIG. 1B.

Figure 6:
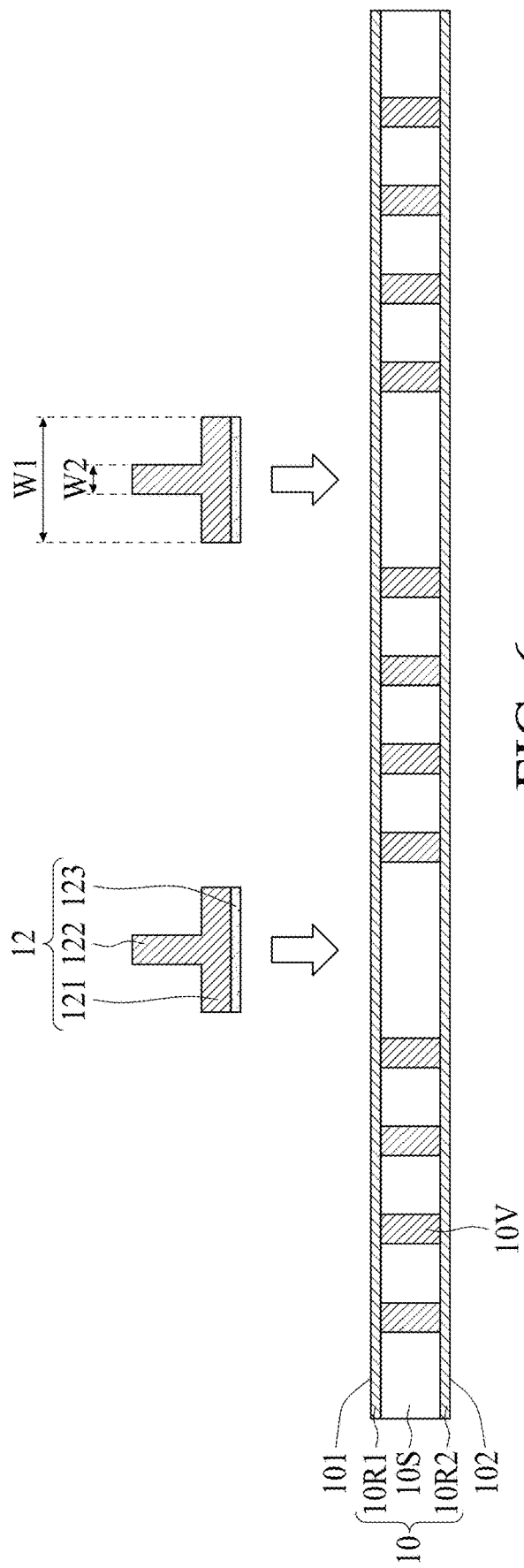
FIG. 6 illustrates one or more stages of a method for manufacturing a semiconductor device package in accordance with some embodiments of the subject application.

FIG. 6 illustrates one or more stages of a method for manufacturing a semiconductor device package in accordance with some embodiments of the subject application. Referring to FIG. 6, the first thermal dissipation element 12 is pre-formed before being attached to the first die 10. The first thermal dissipation element 12 may include a thermal conductive layer 123 working as an interface material between the first thermal dissipation element 12 to the first die 10. The stage in FIG. 6 may be followed by a stage similar to the stage of FIG. 5J. Afterward, an electrical contact 15 may be formed on the second surface 102 of the first die 10 and a singulation operation may be performed to form some semiconductor device package 1 described and illustrated in FIG. 1B.

Figure 7B:
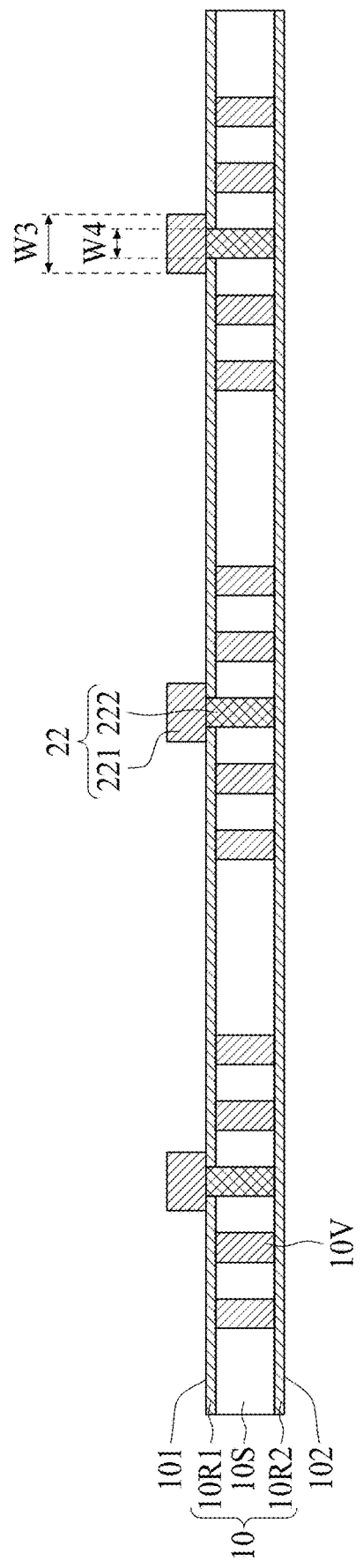
Figure 7C:
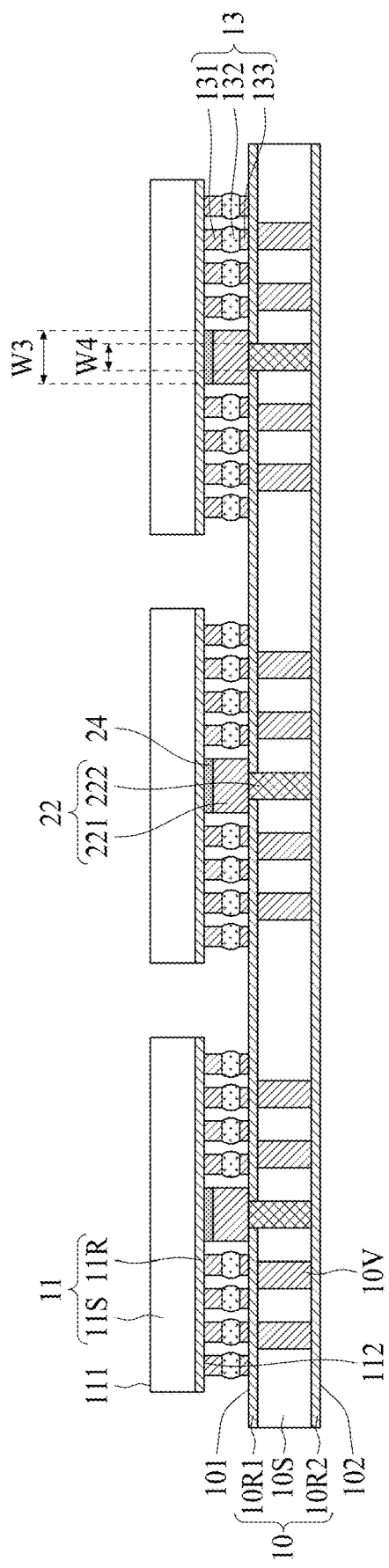

FIG. 7A, FIG. 7B, and FIG. 7C illustrate one or more stages of a method for manufacturing a semiconductor device package in accordance with some embodiments of the subject application.

Referring to FIG. 7A, a first die 10 having a first surface 101 and a second surface 102 is provided. The first die 10 includes a substrate 10S, a first RDL 10R1 adjacent to the first surface 101, a second RDL 10R2 adjacent to the second surface 102, and a plurality of through vias 10V extending through the substrate 10S. A thermal conductive structure 70 is disposed in the first die 10. Referring to FIG. 7B, a thermal conductive material may be formed in several stages similar to the stages in FIG. 5C through 5E or to the stage in FIG. 6. Subsequently, the thermal conductive structure 70 and thermal conductive material form a second thermal dissipation element 22. A first portion 221 of the thermal dissipation element 22 has a third width W3 greater than a fourth width W4 of a second portion 222 of the thermal dissipation element 22. Referring to FIG. 7C, at least one second dies 11 are attached to the first surface 101 of the first die 10 via a plurality of connection structure 13.

Furthermore, an electrical contact 15 may be formed on the second surface 102 of the first die 10 and a singulation operation may be performed to form some semiconductor device package 3 described and illustrated in FIG. 3B.

Figure 8A:
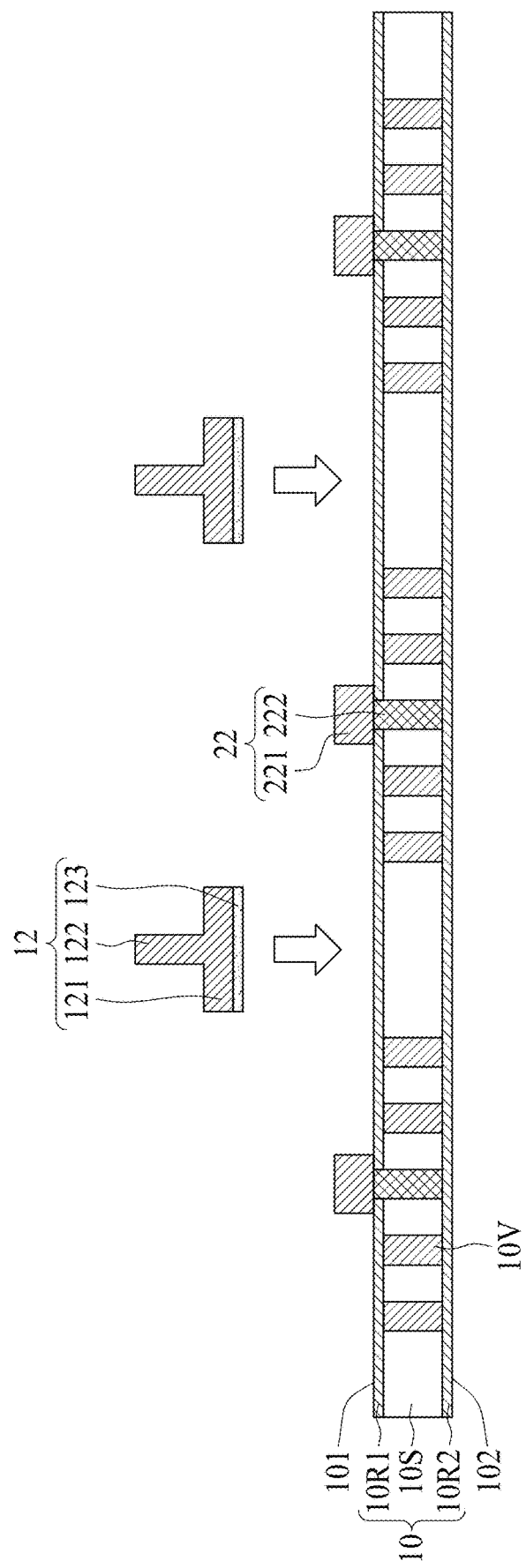
FIG. 8A and FIG. 8B illustrate one or more stages of a method for manufacturing a semiconductor device package in accordance with some embodiments of the subject application.
Figure 8B:
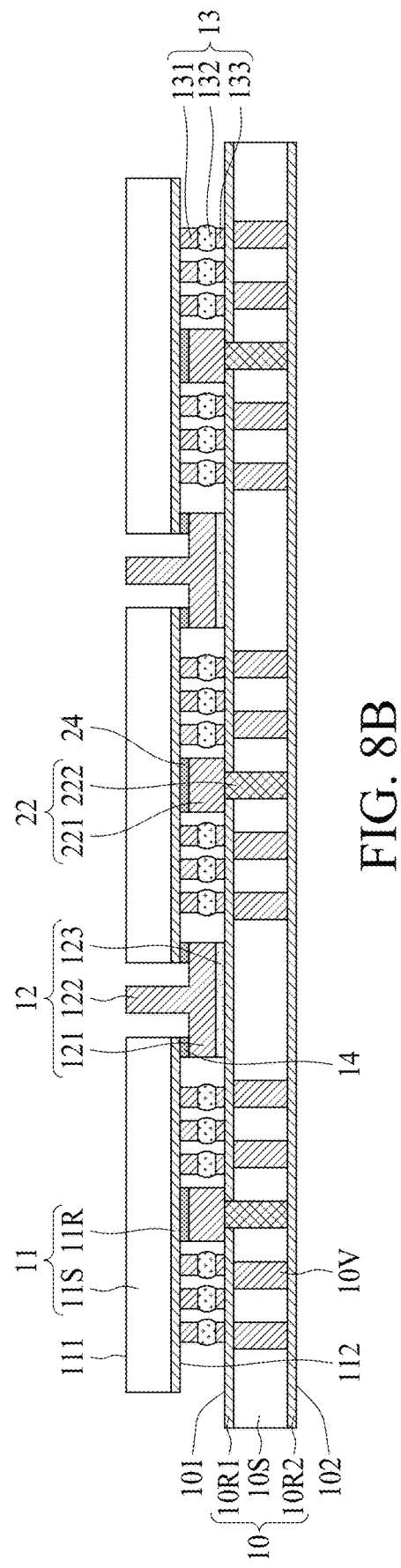

FIG. 8A and FIG. 8B illustrate one or more stages of a method for manufacturing a semiconductor device package in accordance with some embodiments of the subject application.

Referring to FIG. 8A, a first thermal dissipation element 12 is attached to the first surface 101 of the first die 10 after the stage of FIG. 7B. Referring to FIG. 8B, at least one second dies 11 are attached to the first surface 101 of the first die 10 via a plurality of connection structure 13.

Furthermore, an electrical contact 15 may be formed on the second surface 102 of the first die 10 and a singulation operation may be performed to form some semiconductor device package 4a described and illustrated in FIG. 4A.

As used herein the term "active surface" may refer to a surface of an electronic component on which contact terminals such as contact pads are disposed, and the term "inactive surface" may refer to another surface of the electronic component opposite to the active surface on which no contact terminals are disposed.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 within 5 within 1 or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device package, comprising:
a first die having a first surface;
a second die disposed on the first surface; and
a thermal dissipation element disposed on the first surface;
wherein the thermal dissipation element includes a first portion extending in a first direction substantially parallel to the first surface and partially covered by the second die, and a second portion extending in a second direction substantially perpendicular to the first surface to be adjacent to an edge of the second die, and wherein the second die has a second surface facing toward the first surface of the first die, the second die comprises a first redistribution layer disposed adjacent to the second surface, and the first redistribution layer includes a dummy pad disposed on the first portion.

2. The semiconductor device package of claim 1, wherein the first portion has a first width, and the second portion has a second width, and wherein the first width is greater than the second width.

3. The semiconductor device package of claim 1, wherein the thermal dissipation element includes a pre-formed thermal conductive structure.

4. The semiconductor device package of claim 1, wherein the thermal dissipation element is electrically floating.

5. The semiconductor device package of claim 1, further comprising a thermal conductive layer disposed between the first portion of the thermal dissipation element and the first surface of the first die.

6. The semiconductor device package of claim 1, further comprising a thermal sink disposed on the second die, wherein a top surface of the second portion is in contact with the thermal sink.

7. The semiconductor device package of claim 6, wherein a first thermal conductive path is established among the second die and the first die, and a third thermal conductive path is established among the second die, the thermal dissipation element and the thermal sink.

8. The semiconductor device package of claim 1, further comprising another second die disposed on the first surface, wherein the second die and the another second die are separated with a space, and the second portion of the thermal dissipation element is disposed in the space and respectively separated from the second die and the another second die.

9. The semiconductor device package of claim 8, further comprising a thermal sink disposed on the of second die and the another second die, and an adhesive layer disposed between the second die and the thermal sink, wherein the adhesive layer includes an extending portion at least partially disposed in the space.

10. The semiconductor device package of claim 8, further comprising an underfill partially disposed in the space, wherein the underfill has a tapered profile.

11. A semiconductor device package, comprising:
a first electronic component including a plurality of through vias;
a second electronic component disposed on the first electronic component; and
a first thermal dissipation element including a first portion disposed between the first electronic component and the second electronic component, and a second portion connected to the first portion and extending through the first electronic component,
wherein the first thermal dissipation element is electrically floated from the plurality of through vias.

12. The semiconductor device package of claim 11, wherein the first portion has a first width and the second portion has a second width, and the first width is greater than the second width.

13. The semiconductor device package of claim 11, wherein the first thermal dissipation element includes a pre-formed thermal conductive structure.

14. The semiconductor device package of claim 11, further comprising a second thermal dissipation element including a third portion partially overlapping the second electronic component and a fourth portion protruding from the third portion and spaced apart from the second electronic component.

15. A method of manufacturing a semiconductor device package, comprising:
providing a first die and at least one second die; and
forming a thermal dissipation element between the first die and the at least second die,
wherein the thermal dissipation element includes a first portion disposed between the first die and the at least one second die, and a second portion protruding from the first portion, and
wherein the thermal dissipation element is electrically floated from the second die;
wherein the first die includes a plurality of through vias, and the thermal dissipation element is electrically floated from the first die.

16. The method of claim 15, wherein the first portion has a first width and the second portion has a second width, and the first width is greater than the second width.

17. The method of claim 15, wherein the thermal dissipation element includes a pre-formed thermal conductive structure.

18. The method of claim 15, further comprising disposing a thermal conductive element on the first portion of the thermal dissipation element.

19. The method of claim 15, further comprising forming a thermal sink on the at least one second die.

* * * * *